United States Patent
Yuan et al.

(10) Patent No.: US 11,972,821 B2
(45) Date of Patent: Apr. 30, 2024

(54) SHIFT REGISTER UNIT AND CONTROL METHOD THEREOF, GATE DRIVING CIRCUIT, AND DISPLAY DEVICE

(71) Applicants: Hefei BOE Joint Technology Co., Ltd., Anhui (CN); BOE Technology Group Co., Ltd., Beijing (CN)

(72) Inventors: Zhidong Yuan, Beijing (CN); Yongqian Li, Beijing (CN); Can Yuan, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/766,828

(22) PCT Filed: Apr. 15, 2021

(86) PCT No.: PCT/CN2021/087472
§ 371 (c)(1),
(2) Date: Apr. 6, 2022

(87) PCT Pub. No.: WO2021/227766
PCT Pub. Date: Nov. 18, 2021

(65) Prior Publication Data
US 2024/0087661 A1    Mar. 14, 2024

(30) Foreign Application Priority Data
May 9, 2020    (CN) .......................... 202010385861.1

(51) Int. Cl.
*G11C 19/28*    (2006.01)
*G09G 3/32*    (2016.01)

(52) U.S. Cl.
CPC ............... *G11C 19/28* (2013.01); *G09G 3/32* (2013.01); *G09G 2300/0426* (2013.01); *G09G 2310/0286* (2013.01); *G09G 2310/08* (2013.01)

(58) Field of Classification Search
CPC .. G11C 19/28; G09G 3/32; G09G 2300/0426; G09G 2310/0286; G09G 2310/08
See application file for complete search history.

(56) References Cited

U.S. PATENT DOCUMENTS

| 2010/0177082 A1* | 7/2010 | Joo | G09G 3/3677 |
| | | | 345/87 |
| 2016/0071614 A1* | 3/2016 | Lee | G09G 3/3677 |
| | | | 377/67 |

(Continued)

FOREIGN PATENT DOCUMENTS

| CN | 104299583 A | 1/2015 |
| CN | 104835465 A | 8/2015 |

(Continued)

OTHER PUBLICATIONS

CN 202010385861.1 first office action.
PCT/CN2021/087472 international search report and written opinion.

*Primary Examiner* — Jonathan A Boyd
(74) *Attorney, Agent, or Firm* — IPro, PLLC

(57) ABSTRACT

A shift register unit and a control method thereof, a gate driving circuit, and a display device are provided. The shift register unit comprises: a first control circuit (110) and an energy storage circuit (150), which directly control the potential of a first node (Q1); a pull-down control circuit (120), a second control circuit (130) and a first pull-down circuit (140), which indirectly control the potential of the first node (Q1); and an output circuit (160), which outputs, under the control of the potential of the first node (Q1), a first (Continued)

voltage signal provided by a first voltage end (VDD) to a signal output end. By means of the shift register unit, the control method thereof and the gate drive circuit, the pulse width of a gate scanning signal can be adjusted, thereby meeting various display requirements.

20 Claims, 4 Drawing Sheets

(56) References Cited

U.S. PATENT DOCUMENTS

| | | | |
|---|---|---|---|
| 2017/0046998 A1 | 2/2017 | Zhang et al. | |
| 2017/0278450 A1* | 9/2017 | Ma | G09G 3/3677 |
| 2017/0330633 A1* | 11/2017 | Sun | G09G 3/20 |
| 2018/0144811 A1* | 5/2018 | Han | G09G 3/3233 |
| 2018/0277043 A1* | 9/2018 | Li | G11C 19/184 |
| 2019/0325834 A1 | 10/2019 | Feng et al. | |
| 2021/0142713 A1 | 5/2021 | Feng et al. | |
| 2021/0335301 A1 | 10/2021 | Liang et al. | |
| 2021/0358362 A1 | 11/2021 | Zhang | |

FOREIGN PATENT DOCUMENTS

| | | |
|---|---|---|
| CN | 105304057 A | 2/2016 |
| CN | 105405417 A | 3/2016 |
| CN | 105741802 A | 7/2016 |
| CN | 108520724 A | 9/2018 |
| CN | 108564914 A | 9/2018 |
| CN | 108806584 A | 11/2018 |
| CN | 109935269 A | 6/2019 |
| CN | 109979396 A | 7/2019 |
| CN | 110060645 A | 7/2019 |
| CN | 110264948 A | 9/2019 |
| CN | 110491329 A | 11/2019 |
| CN | 111445833 A | 7/2020 |
| KR | 20170078978 A | 7/2017 |

* cited by examiner

11,972,821 B2

SHIFT REGISTER UNIT AND CONTROL METHOD THEREOF, GATE DRIVING CIRCUIT, AND DISPLAY DEVICE

CROSS-REFERENCE TO RELATED APPLICATIONS

This application is the U.S. national phase of PCT Application No. PCT/CN2021/087472 filed on Apr. 15, 2021, which claims priority to Chinese Patent Application No. 202010385861.1 filed in China on May 9, 2020, the entire contents of which are incorporated herein by reference.

TECHNICAL FIELD

The present disclosure relates to the technical field of display, and more particularly, to a shift register unit and a control method thereof, a gate driving circuit, and a display device.

BACKGROUND

In the display industry, in order to reduce the manufacturing cost of a display panel and realize the design of a narrow frame of the display panel, more and more gate driving circuits adopt a GOA (gate drive on array) technology, i.e., integrating a gate switching circuit onto an array substrate of the display panel.

In the related art, the display device adopting the GOA technology has difficulty in adjusting the pulse width of a gate scanning signal.

SUMMARY

The embodiments of the present disclosure provide a shift register unit and a control method thereof, a gate driving circuit, and a display device to solve the problem in the related art that the display device adopting a GOA technology has difficulty in adjusting the pulse width of a gate scanning signal.

In order to solve the above-mentioned technical problem, the present disclosure provides the following technical solutions.

In a first aspect, embodiments of the present disclosure provide a shift register unit including a first control circuit, a pull-down control circuit, a second control circuit, a first pull-down circuit, an energy storage circuit, and an output circuit, wherein the first control circuit is configured for writing a first clock signal provided by a first clock signal end into a first node under the potential control of a cascade output end;

the pull-down control circuit is configured for writing the electrical signal of a second node into a control end of the first pull-down circuit under the control of a second clock signal provided by the second clock signal end;

the second control circuit is configured for writing a third clock signal provided by a third clock signal end into the control end of the first pull-down circuit under the control of the input signal provided by an input signal end;

the first pull-down circuit is configured for pulling down the potential of the first node under the control of the potential of the control end of the first pull-down circuit;

the energy storage circuit is configured for controlling the potential of the first node;

the output circuit is configured to output a first voltage signal provided by the first voltage end to the signal output end under the control of the potential of the first node.

Further, the first control circuit includes a first transistor and a second transistor, a control electrode of the first transistor is electrically connected to the cascade output end, a first electrode of the first transistor is electrically connected to the first clock signal end, a second electrode of the first transistor is electrically connected to the first electrode of the second transistor, the second electrode of the second transistor is electrically connected to the first node, and the control electrode of the second transistor is electrically connected to the first clock signal end.

Further, the first pull-down circuit includes a third transistor, the control electrode of the third transistor is electrically connected to an output end of the pull-down control circuit, a first electrode of the third transistor is electrically connected to the first node, and a second electrode of the third transistor is electrically connected to a second voltage end.

Further, the pull-down control circuit includes a fourth transistor, the control electrode of the fourth transistor is electrically connected to the second clock signal end, the first electrode of the fourth transistor is electrically connected to the second node, and the second electrode of the fourth transistor is electrically connected to the control end of the first pull-down circuit.

Further, the output circuit includes a fifth transistor and a sixth transistor, wherein the first electrode of the fifth transistor is electrically connected to the first voltage end, the second electrode of the fifth transistor is electrically connected to the first electrode of the sixth transistor, and a control electrode of the fifth transistor is electrically connected to the first node; and the control electrode of the sixth transistor is electrically connected to the output end of the pull-down control circuit, and the second electrode of the sixth transistor is electrically connected to the second voltage end.

Further, the second control circuit includes a seventh transistor, the control electrode of the seventh transistor is electrically connected to the input signal end, the first electrode of the seventh transistor is electrically connected to the third clock signal end, and the second electrode of the seventh transistor is electrically connected to the control end of the first pull-down circuit.

Further, the energy storage circuit includes a capacitor, wherein one end of the capacitor is electrically connected to the first voltage end and the other end of the capacitor is electrically connected to the first node.

Further, the shift register further includes an input circuit, a third control circuit, an inverter circuit, and a cascade circuit;

the input circuit is configured for writing the input signal provided by the input signal end into the control end of the third control circuit under the control of the third clock signal;

the third control circuit is configured for writing the second clock signal provided by the second clock signal end into the third node under the control of the input signal;

the inverter circuit is configured for writing an electrical signal with an opposite potential to the third node to the second node; and the cascade circuit is configured for writing the first voltage signal provided by the first voltage end into the cascade output end under the control of the potential of the third node.

Further, the input circuit includes an eighth transistor, wherein the control electrode of the eighth transistor is electrically connected to the third clock signal end, the first electrode of the eighth transistor is electrically connected to the input signal end, and the second electrode of the eighth transistor is electrically connected to the control electrode of the third control circuit.

Further, the third control circuit includes a ninth transistor and a tenth transistor;

the control electrode of the ninth transistor is electrically connected to the output end of the input circuit, the first electrode of the ninth transistor is electrically connected to the second timing signal end, and the second electrode of the ninth transistor is electrically connected to the first electrode of the tenth transistor; and the control electrode of the tenth transistor is electrically connected to the second timing signal end, and the second electrode of the tenth transistor is electrically connected to the third node.

Further, the inverter circuit includes an eleventh transistor, a twelfth transistor, a thirteenth transistor, and a fourteenth transistor, wherein the control electrode of the eleventh transistor is electrically connected to the first voltage end, the first electrode of the eleventh transistor is electrically connected to the third timing signal end, and the second electrode of the eleventh transistor is electrically connected to the control electrode of the twelfth transistor;

the first electrode of the twelfth transistor is electrically connected to the first voltage end, and the second electrode of the twelfth transistor is electrically connected to the second node;

the control electrode of the thirteenth transistor is electrically connected to the input signal end, the first electrode of the thirteenth transistor is electrically connected to the second electrode of the eleventh transistor, and the second electrode of the thirteenth transistor is electrically connected to the second voltage end; and the control electrode of the fourteenth transistor is electrically connected to the input signal end, the first electrode of the fourteenth transistor is electrically connected to the second node, and the second electrode of the fourteenth transistor is electrically connected to the second voltage end.

Further, the cascade circuit includes a fifteenth transistor and a sixteenth transistor, wherein the control electrode of the fifteenth transistor is electrically connected to the third node, the first electrode of the fifteenth transistor is electrically connected to the first voltage end, and the second electrode of the fifteenth transistor is electrically connected to the cascade output end;

the control electrode of the sixteenth transistor is electrically connected to the second node, the first electrode of the sixteenth transistor is electrically connected to the second electrode of the fifteenth transistor, and the second electrode of the sixteenth transistor is electrically connected to the second voltage end.

Further, the shift register further includes a reset circuit, wherein the reset circuit is configured to pull up the potential of the second node under control of a reset signal provided by a reset signal line.

Further, the reset circuit includes a seventeenth transistor, wherein the control electrode of the seventeenth transistor is electrically connected to the reset signal line, the first electrode of the seventeenth transistor is electrically connected to the first voltage end, and the second electrode of the seventeenth transistor is electrically connected to the second node.

In a second aspect, embodiments of the present disclosure also provide a driving method of the shift register unit, operably by the shift register unit as described above, the method includes:

a first stage, which includes a first stage and a second sub-stage arranged alternately; in a first sub-phase, a first clock signal is written into the first node, so that the output circuit outputs a high potential signal; in a second sub-phase, the input signal controls the first pull-down circuit to pull down the potential of the first node so that the output circuit outputs a low potential signal;

a second stage, which includes a third sub-stage and a fourth sub-stage, wherein in the third sub-phase, a first clock signal is written into the first node, so that the output circuit outputs the high potential signal; in the fourth sub-stage, the capacitor bootstraps to maintain the potential of the first node, and the output circuit continuously outputs the high potential signal; and a third stage, wherein in the third stage, a second clock signal controls the pull-down circuit to pull down the potential of the first node so that the output circuit outputs the low potential signal.

In a third aspect, embodiments of the present disclosure also provide a gate driving circuit which includes the shift register unit as described above.

BRIEF DESCRIPTION OF THE DRAWINGS

In order to illustrate the technical solutions of the embodiments of the present disclosure more clearly, the following briefly introduces the accompanying drawings used in the description of the embodiments of the present disclosure. Obviously, the accompanying drawings in the following description are only some embodiments of the present disclosure. For those of ordinary skill in the art, other drawings can also be obtained from these drawings without creative labor.

DETAILED DESCRIPTION

The technical solutions in the embodiments of the present disclosure will be clearly and completely described below with reference to the accompanying drawings in the embodiments of the present disclosure. Obviously, the described embodiments are part of the embodiments of the present disclosure, but not all of the embodiments.

Based on the embodiments in the present disclosure, all other embodiments obtained by those of ordinary skill in the art without creative efforts shall fall within the protection scope of the present disclosure.

It should be noted that, a transistor mentioned in the embodiment of the present application may be a P-type transistor, in which a first electrode is a drain electrode and a second electrode is a source electrode; it may be an N-type transistor in which the first electrode is the source electrode and the second electrode is the drain electrode. The above-mentioned transistor may all be transistors of the same type or may be transistors of different types, respectively, which are not limited herein. In addition, the effective potential mentioned in the embodiment of the present application is potential capable of conducting the first electrode and the second electrode of the transistor that are connected. For example, when the transistor is the N-type transistor, the effective potential is high and the ineffective potential is low.

Figure 1:
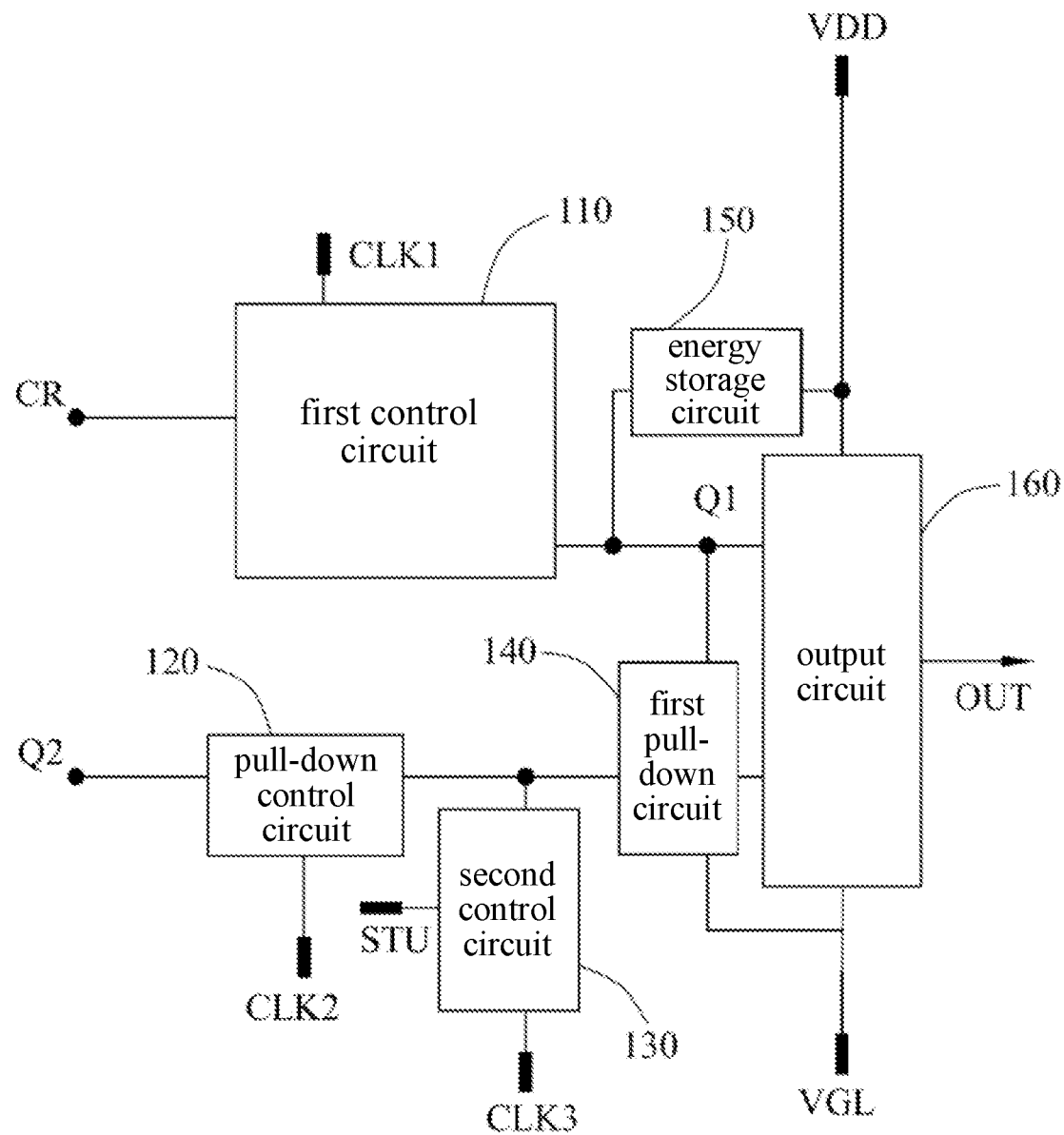
FIG. 1 is a partial structural diagram of a shift register unit according to an embodiment of the present disclosure.

The embodiment of the present disclosure provides a shift register unit, as shown in FIG. 1, including a first control circuit 110, a pull-down control circuit 120, a second control circuit 130, a first pull-down circuit 140, an energy storage circuit 150, and an output circuit 160, wherein the first control circuit 110 is configured for writing the first clock signal provided by the first clock signal end CLK1 into the first node Q1 under the control of the potential of the cascade output end CR;

the pull-down control circuit 120 is configured for writing the electrical signal of the second node Q2 into the control end of the first pull-down circuit 140 under the control of the second clock signal provided by the second clock signal end CLK2;

the second control circuit 130 is configured for writing a third clock signal provided by a third clock signal end CLK3 into the control end of the first pull-down circuit 140 under the control of an input signal provided by an input signal end STU;

the first pull-down circuit 140 is configured for pulling down the potential of the first node Q1 under the control of the potential of the control end of the first pull-down circuit 140;

the energy storage circuit 150 is configured for controlling the potential of the first node Q1; and the output circuit 160 is configured for outputting the first voltage signal provided by the first voltage end VDD to the signal output end under the control of the potential of the first node Q1.

In the embodiments of the present disclosure, the potential of the first node is directly controlled by the first control circuit and the energy storage circuit, and the potential of the first node is indirectly controlled by the pull-down control circuit and the second control circuit through the control of the first pull-down circuit, so as to realize a variety of controls on the potential of the first node, and then the pulse width of the gate scanning signal outputted by the output circuit is changed by controlling the potential of the first node, so as to realize the adjustment of the pulse width of the gate scanning signal. Therefore, the technical solution provided by the present disclosure can realize the adjustment of the pulse width of the gate scanning signal to satisfy various display requirements.

The control end of the above-mentioned first control circuit 110 is electrically connected to the cascade output end CR, the input end of the first control circuit 110 is electrically connected to the first clock signal end CLK1, and the output end of the first control circuit 110 is electrically connected to the first node Q1. The conduction between the first clock signal end CLK1 and the first node Q1 is implemented under the control of the cascade signal outputted from the cascade output end CR, so that the first clock signal provided by the first clock signal end CLK1 is written into the first node Q1.

The control end of the above-mentioned pull-down control circuit 120 is electrically connected to the second clock signal end CLK2, the input end of the pull-down control circuit 120 is electrically connected to the second node Q2, and the output end of the pull-down control circuit 120 is electrically connected to the control end of the first pull-down circuit 140. The conduction between the second node Q2 and the control end of the first pull-down circuit 140 is implemented under the control of the second clock signal provided by the second clock signal end CLK2, so that the electrical signal of the second node Q2 is written to the control end of the first pull-down circuit 140.

The control end of the above-mentioned second control circuit 130 is electrically connected to the input signal end STU, the input end of the second control circuit 130 is electrically connected to the third clock signal end, and the output end of the second control circuit 130 is electrically connected to each of the control end of the first pull-down circuit 140 and the output circuit 160. The conduction between the third clock signal end and the control end of the first pull-down circuit 140 is implemented under the control of the input signal provided by the input signal end STU, so that the third clock signal provided by the third clock signal end is written to the control end of the first pull-down circuit 140.

The input end of the above-mentioned first pull-down circuit 140 is electrically connected to the first node Q1, and the output end of the above-mentioned first pull-down circuit 140 is electrically connected to the second voltage end VGL. Under the control of the potential of the control end of the first pull-down circuit 140, the first node Q1 is controlled to conduct with the second voltage end VGL, so that the potential of the first node Q1 is pulled down.

One end of the above-mentioned energy storage circuit 150 is electrically connected to the first voltage end VDD, and the other end of the energy storage circuit 150 is electrically connected to the first node Q1 for preventing an abrupt change in the potential of the first node Q1.

The first control end of the above-mentioned output circuit 160 is electrically connected to the first node Q1; the second control end of the above-mentioned output circuit 160 is electrically connected to the output end of the second control circuit 130; the input end of the above-mentioned output circuit 160 is electrically connected to the first voltage end VDD; and the signal output end of the above-mentioned output circuit 160 can be electrically connected to the gate line in the pixel driving circuit. Under the control of the potential of the first node Q1, the conduction between the first voltage end VDD and the signal output end of the output circuit 160 is controlled, so that the signal output end of the output circuit 160 outputs the first voltage signal provided by the first voltage end VDD; the conduction between the second voltage end VGL and the signal output end of the output circuit 160 is controlled under the control of the potential of the output end of the second control circuit 130, so that the signal output end of the output circuit 160 outputs the second voltage signal provided by the second voltage end VGL.

In the present embodiment, the first voltage end VDD continuously supplies the first voltage signal which has the effective potential.

Figure 2:
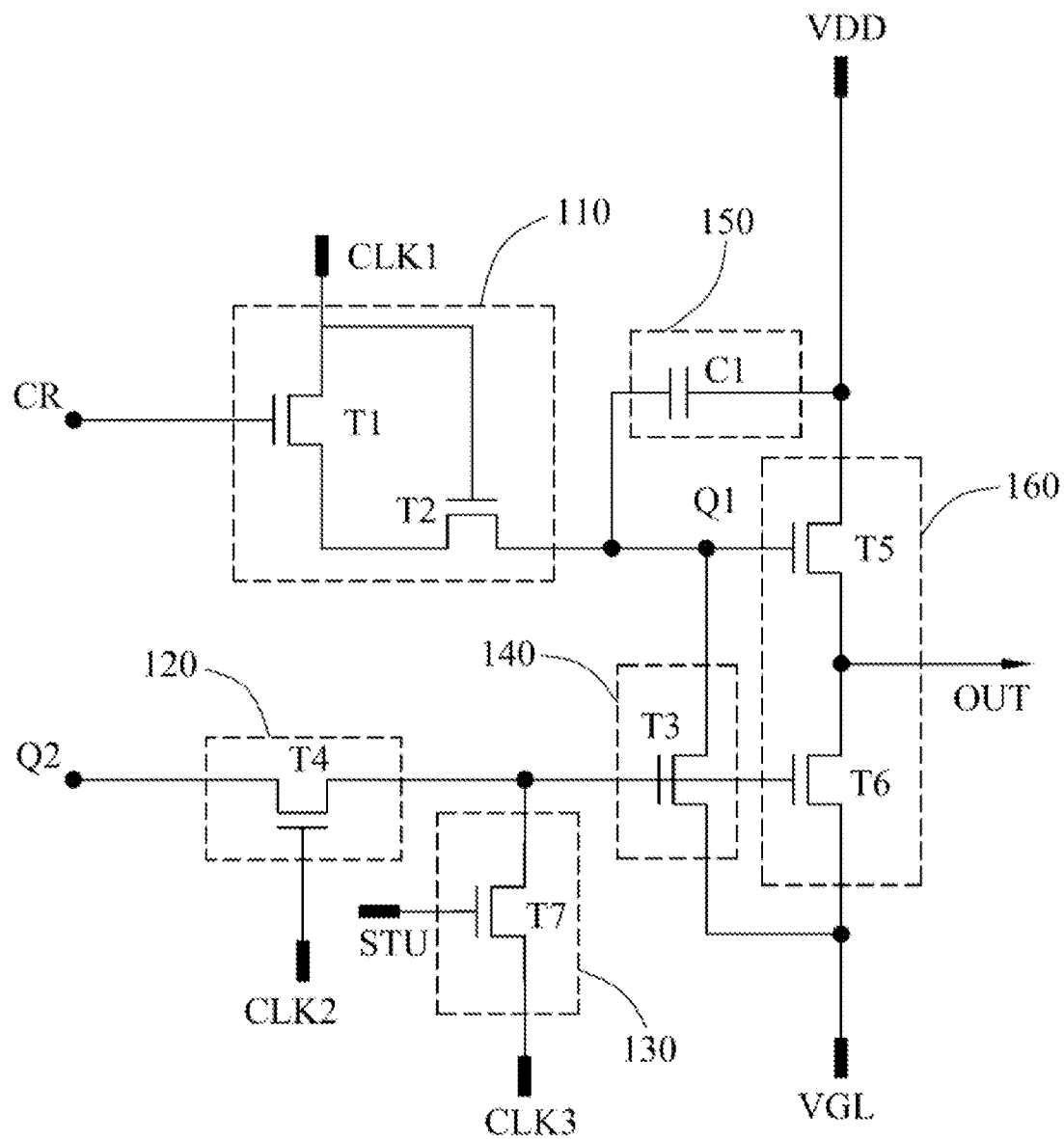
FIG. 2 is a circuit diagram corresponding to FIG. 1.

Further, as shown in FIG. 2, the first control circuit 110 includes the first transistor T1 and the second transistor T2, wherein the control electrode of the first transistor T1 is electrically connected to the cascade output end CR, the first electrode of the first transistor T1 is electrically connected to the first clock signal end CLK1, the second electrode of the first transistor T1 is electrically connected to the first electrode of the second transistor T2, the second electrode of the second transistor T2 is electrically connected to the first node Q1, and the control electrode of the second transistor T2 is electrically connected to the first clock signal end CLK1.

When the potential of the cascade signal provided by the cascade output end CR is an effective potential and the potential of the first clock signal is also the effective potential, it enables to conduct the first electrode of the first transistor T1 and the second electrode of the second transistor T2, and conduct the first electrode of the second transistor T2 and the second electrode of the second transistor T2, and directly write the first clock signal into the first node Q1. At this time, the potential of the first node Q1 is the effective potential, so that the output circuit 160 outputs the first voltage signal provided by the first voltage end VDD.

Further, as shown in FIG. 2, the first pull-down circuit 140 includes the third transistor T3, the control electrode of the third transistor T3 is electrically connected to the output end of the pull-down control circuit 120, the first electrode of the third transistor T3 is electrically connected to the first node Q1, and the second electrode of the third transistor T3 is electrically connected to the second voltage end VGL.

In the present embodiment, the second voltage end VGL continuously provides the second voltage signal which has the potential that is an ineffective potential.

When the potential of the control electrode of the third transistor T3 is the effective potential, the first electrode of the third transistor T3 and the second electrode of the third transistor T3 are conducted, and at this time, the first node Q1 is connected to the second voltage end VGL so as to pull down the potential of the first node Q1, thereby enabling the output circuit 160 to stop outputting the first voltage signal.

Further, as shown in FIG. 2, the pull-down control circuit 120 includes the fourth transistor T4, the control electrode of the fourth transistor T4 is electrically connected to the second clock signal end CLK2, the first electrode of the fourth transistor T4 is electrically connected to the second node Q2, and the second electrode of the fourth transistor T4 is electrically connected to the control end of the first pull-down circuit 140.

When the potential of the second clock signal is the effective potential and the potential of the second node Q2 is also the effective potential, it enables to conduct the first electrode of the fourth transistor T4 and the second electrode of the fourth transistor T4, and directly write the effective potential of the second node Q2 into the control electrode of the first pull-down circuit 140, so that the first node Q1 is conductive with the second voltage end VGL, thereby pulling down the potential of the first node Q1 and enabling the output circuit 160 to stop outputting the first voltage signal.

Further, as shown in FIG. 2, the output circuit 160 includes the fifth transistor T5 and the sixth transistor T6, wherein the first electrode of the fifth transistor T5 is electrically connected to the first voltage end VDD, the second electrode of the fifth transistor T5 is electrically connected to the first electrode of the sixth transistor T6, and the control electrode of the fifth transistor T5 is electrically connected to the first node Q1;

the control electrode of the sixth transistor T6 is electrically connected to the control end of the pull-down control circuit 120, and the second electrode of the sixth transistor T6 is electrically connected to the second voltage end VGL.

In the case where the potential of the first node Q1 is the effective potential, the first electrode of the pull-down control circuit 120 and the second electrode of the pull-down control circuit 120 must be disconnected, i.e., the potential of the control end of the pull-down control circuit 120 is the ineffective potential, and since the control electrode of the sixth transistor T6 is electrically connected to the control end of the pull-down control circuit 120, the potential of the control electrode of the sixth transistor T6 is the ineffective potential, and the first electrode of the sixth transistor T6 is disconnected from the second electrode of the sixth transistor T6. At this time, the fifth transistor T5 outputs the first voltage signal at the first voltage end VDD under the control of the effective potential of the first node Q1.

In the case where the potential of the control electrode of the sixth transistor T6 is the effective potential, since the control electrode of the sixth transistor T6 is electrically connected to the control end of the pull-down control circuit 120, the first electrode of the pull-down control circuit 120 is conductive with the second electrode of the pull-down control circuit 120, the pull-down control circuit 120 pulls down the potential of the first node Q1, so that the first electrode of the fifth transistor T5 and the second electrode of the fifth transistor T5 are disconnected, and the first electrode of the sixth transistor T6 and the second electrode of the sixth transistor T6 are conductive, so that the signal output end of the output circuit 160 outputs the second voltage signal.

Further, as shown in FIG. 2, the second control circuit 130 includes the seventh transistor T7, the control electrode of the seventh transistor T7 is electrically connected to the input signal end STU, the first electrode of the seventh transistor T7 is electrically connected to the third clock signal end, and the second electrode of the seventh transistor T7 is electrically connected to the control end of the first pull-down circuit 140.

When the potential of the input signal is the effective potential and the potential of the third clock signal is also the effective potential, the first electrode of the seventh transistor T7 and the second electrode of the seventh transistor T7 are conducted, and the effective potential of the third clock signal is directly written into the control electrode of the first pull-down circuit 140, so that the first node Q1 and the second voltage end VGL are conducted, thereby pulling down the potential of the first node Q1, and enabling the output circuit 160 to stop outputting the first voltage signal.

Further, as shown in FIG. 2, the energy storage circuit 150 includes the first capacitor C1, one end of the first capacitor C1 is electrically connected to the first voltage end VDD, and the other end of the first capacitor C1 is electrically connected to the first node Q1.

When the first electrode of the first pull-down circuit 140 is disconnected from the second electrode of the first pull-down circuit 140, and the potential of the first clock signal changes from the effective potential to the ineffective potential, the first capacitor C1 bootstraps in order to prevent the current of the first node Q1 from abruptly changing, so that the first node Q1 maintains the effective potential, and thus the output circuit 160 continues to output the first voltage signal.

Figure 3:
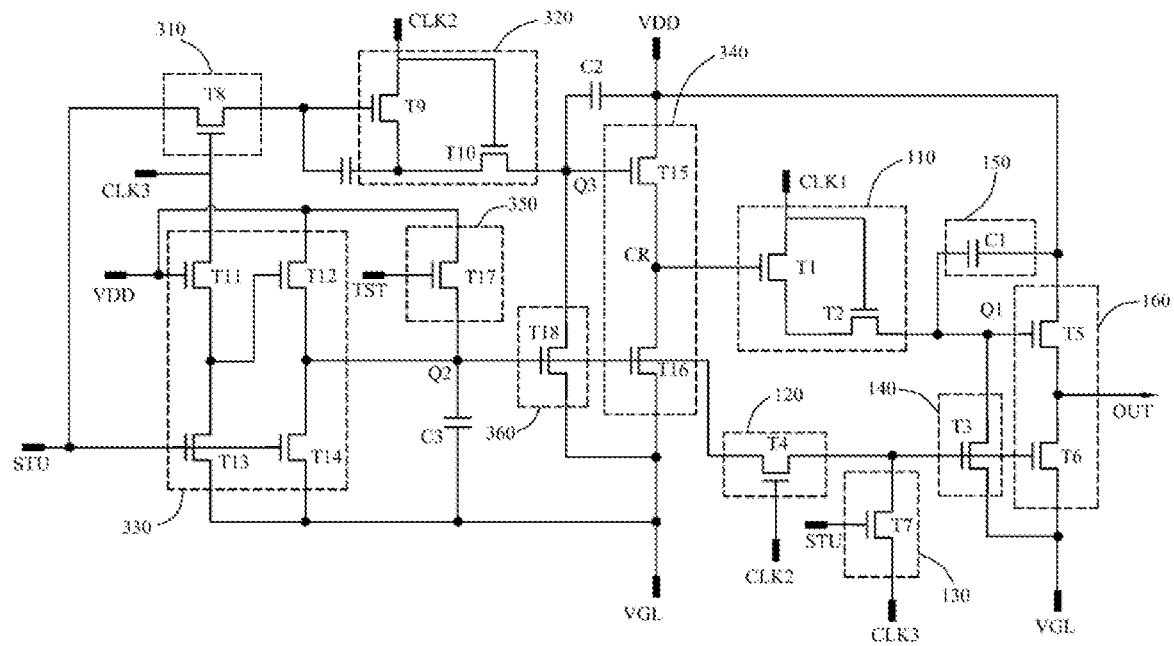
FIG. 3 is a circuit diagram of a shift register unit provided in another embodiment of the present disclosure.

Further, as shown in FIG. 3, the shift register further includes an input circuit 310, a third control circuit 320, an inverter circuit 330, and a cascade circuit 340, wherein the input circuit 310 is configured for writing the input signal provided by the input signal end STU into the control end of the third control circuit 320 under the control of the third clock signal;

the third control circuit 320 is configured for writing the second clock signal provided by the second clock signal end CLK2 into the third node Q3 under the control of the input signal;

the inverter circuit 330 is configured for writing the electrical signal with the potential opposite to the third node Q3 to the second node Q2; and the cascade circuit 340 is configured for writing the first voltage signal provided by the first voltage end VDD into the cascade output end CR under the control of the potential of the third node Q3.

In the present embodiment, the control end of the input circuit 310 is electrically connected to the third clock signal end, the first end of the input circuit 310 is electrically connected to the input signal end STU, and the second end of the input circuit 310 is electrically connected to the control end of the third control circuit 320. The input signal is written to the first end of the input circuit 310 under control that the potential of the third clock signal is the effective potential.

The control end of the above-mentioned third control circuit 320 is electrically connected to the output end of the input circuit 310, the input end of the third control circuit 320 is electrically connected to the second clock signal end CLK2, and the output end of the third control circuit 320 is electrically connected to the third node Q3. The second clock signal is written to the third node Q3 under control that the potential of the input signal is the effective potential.

The first control end of the above-mentioned inverter circuit 330 is electrically connected to the first voltage end VDD, the second control end of the inverter circuit 330 is electrically connected to the input signal end STU, the first input end of the inverter circuit 330 is electrically connected to the third clock signal end, the second input end of the inverter circuit 330 is electrically connected to the first voltage end VDD, and the output end of the inverter circuit 330 is electrically connected to the second node Q2. The inverter circuit 330 is configured for keeping controlling the potential of the second node Q2 to be opposite to the potential of the third node Q3.

The first control end of the above-mentioned cascade circuit 340 is electrically connected to the third node Q3, the second control end of the cascade circuit 340 is electrically connected to the second node Q2, the input end of the cascade circuit 340 is electrically connected to the first voltage end VDD, and the cascade output end CR of the cascade circuit 340 is electrically connected to the control end of the first control circuit 110. When the potential of the third node Q3 is the effective potential and the potential of the second node Q2 is the ineffective potential, the cascade output end CR of the cascade circuit 340 is controlled to conduct with the first voltage end VDD, and the cascade output end CR of the cascade circuit 340 outputs the first voltage signal; and when the potential of the third node Q3 is the ineffective potential and the potential of the second node Q2 is the effective potential, the cascade output end CR of the cascade circuit 340 and the second voltage end VGL are controlled to conduct, and the cascade output end CR of the cascade circuit 340 outputs the second voltage signal.

Further, as shown in FIG. 3, the input circuit 310 includes an eighth transistor T8, wherein the control electrode of the eight transistor T8 is electrically connected to the third clock signal end, the first electrode of the eight transistor T8 is electrically connected to the input signal end STU, and the second electrode of the eight transistor T8 is electrically connected to the control electrode of the third control circuit 320.

When the potential of the third clock signal is the effective potential, it enables to conduct the first electrode of the eighth transistor T8 and the second electrode of the eighth transistor T8, thereby writing the input signal to the control end of the third control circuit 320.

Further, as shown in FIG. 3, the third control circuit 320 includes a ninth transistor T9 and a tenth transistor T10, wherein the control electrode of the ninth transistor T9 is electrically connected to the output end of the input circuit 310, the first electrode of the ninth transistor T9 is electrically connected to the second timing signal end, and the second electrode of the ninth transistor T9 is electrically connected to the first electrode of the tenth transistor T10;

the control electrode of the tenth transistor T10 is electrically connected to the second timing signal end, and the second electrode of the tenth transistor T10 is electrically connected to the third node Q3.

When the potential of the input signal is the effective potential and the potential of the second clock signal is the effective potential, it enables to conduct the first electrode of the ninth transistor T9 and the second electrode of the ninth transistor T9, and conduct the first electrode of the tenth transistor T10 and the second electrode of the tenth transistor T10, and write the effective potential of the second clock signal into the third node Q3.

Further, as shown in FIG. 3, the inverter circuit 330 includes an eleventh transistor T11, a twelfth transistor T12, a thirteenth transistor T13, and a fourteenth transistor T14, wherein the control electrode of the eleventh transistor T11 is electrically connected to the first voltage end VDD, the first electrode of the eleventh transistor T11 is electrically connected to the third timing signal end, and the second electrode of the eleventh transistor T11 is electrically connected to the control electrode of the twelfth transistor T12;

the first electrode of the twelfth transistor T12 is electrically connected to the first voltage end VDD, and the second electrode of the twelfth transistor T12 is electrically connected to the second node Q2;

the control electrode of the thirteenth transistor T13 is electrically connected to the input signal end STU, the first electrode of the thirteenth transistor T13 is electrically connected to the second electrode of the eleventh transistor T11, and the second electrode of the thirteenth transistor T13 is electrically connected to the second voltage end VGL; and the control electrode of the fourteenth transistor T14 is electrically connected to the input signal end STU, the first electrode of the fourteenth transistor T14 is electrically connected to the second node Q2, and the second electrode of the fourteenth transistor T14 is electrically connected to the second voltage end VGL.

The potential of the control electrode of the eleventh transistor T11 is always at the effective potential, the first electrode of the eleventh transistor T11 is electrically connected to the second electrode of the eleventh transistor T11, and the third timing signal is always written into the control electrode of the twelfth transistor T12.

When the potential of the third timing signal is the effective potential, the first electrode of the twelfth transistor T12 and the second electrode of the twelfth transistor T12 are conducted, so that the second electrode of the twelfth transistor T12 outputs the first voltage signal to the second node Q2.

When the potential of the input signal is the effective potential, the first electrode of the thirteenth transistor T13 and the second electrode of the thirteenth transistor T13 are conducted, and the first electrode of the fourteenth transistor T14 and the second electrode of the fourteenth transistor T14 are conducted, so as to pull down the potential of the control electrode of the twelfth transistor T12 and the potential of the second electrode of the twelfth transistor T12, and at this time, the potential of the second node Q2 is the same as the potential of the second voltage signal.

In addition, the second capacitor C2 may be further included, wherein one end of the second capacitor is electrically connected to the first voltage end VDD, and the other end of the second capacitor is electrically connected to the third node Q3.

When the potential of the input signal is the effective potential, the control end of the third control circuit 320 is enabled to obtain the effective potential, and when the potential of the second clock signal is the effective potential, the second clock signal is written into the third node Q3, and at this time, the third node Q3 is the effective potential; when the potential of the second clock signal is a non-effective potential, the second capacitor C2 prevents the potential of the third node Q3 from abruptly changing to provide the effective potential for the third node Q3, and the third node Q3 is still the effective potential. However, when the potential of the input signal is the effective potential, the thirteenth transistor T13 will pull down the potential of the control end of the twelfth transistor T12, and the fourteenth transistor T14 will pull down the potential of the second node Q2, and at this time, the potential of the second node Q2 is the ineffective potential, which is opposite to the potential of the third node Q3.

When the potential of the input signal is the ineffective potential, the first electrode of the twelfth transistor T12 and the second electrode of the twelfth transistor T12 are conducted, the first voltage signal is written into the second node Q2, and the potential of the second node Q2 is the effective potential. However, the potential of the control end of the third control circuit 320 is the ineffective potential, the third node Q3 is the ineffective potential and at this time, the potential of the second node Q2 is the ineffective potential which is opposite to the potential of the third node Q3.

Further, as shown in FIG. 3, the cascade circuit 340 includes a fifteenth transistor T15 and a sixteenth transistor T16, wherein
the control electrode of the fifteenth transistor T15 is electrically connected to the third node Q3, the first electrode of the fifteenth transistor T15 is electrically connected to the first voltage end VDD, and the second electrode of the fifteenth transistor T15 is electrically connected to the cascade output end CR;
the control electrode of the sixteenth transistor T16 is electrically connected to the second node Q2; the first electrode of the sixteenth transistor T16 is electrically connected to the second electrode of the fifteenth transistor T15; and the second electrode of the sixteenth transistor T16 is electrically connected to the second voltage end VGL.

When the potential of the third node Q3 is the effective potential, it conducts the first electrode of the fifteenth transistor T15 and the second electrode of the fifteenth transistor T15, so that the first voltage signal is written into the cascade output end CR, and the cascade output end CR is at the effective potential, thereby enabling the control end of the first control circuit 110 to obtain the effective potential. At this time, the potential of the second node Q2 is the ineffective potential, the first electrode of the sixteenth transistor T16 and the second electrode of the sixteenth transistor T16 are disconnected, and the ineffective potential is provided to the control end of the first pull-down circuit 140.

When the potential of the second node Q2 is the effective potential, it conducts the first electrode of the sixteenth transistor T16 and the second electrode of the sixteenth transistor T16, so that the second voltage signal is written into the cascade output end CR, and the cascade output end CR is at the ineffective potential, thereby enabling the control end of the first control circuit 110 to obtain the ineffective potential. At this time, the potential of the third node Q3 is the ineffective potential, and the first electrode of the fifteenth transistor T15 and the second electrode of the fifteenth transistor T15 are disconnected.

Further, as shown in FIG. 3, the shift register further includes a reset circuit 350, wherein
the reset circuit 350 is configured for pulling up the potential of the second node Q2 under the control of the reset signal provided by the reset signal line TST.

After the end of each frame, the above-mentioned reset signal line TST provides the reset signal with a part of the potential being the effective potential, so that the second node Q2 is electrically connected to the first voltage signal, and the potential of the second node Q2 is the effective potential, thereby achieving the potential of the pull-down cascade output end CR and the potential of the pull-down first node Q1.

Further, as shown in FIG. 3, the reset circuit 350 includes a seventeenth transistor T17, the control electrode of the seventeenth transistor T17 is electrically connected to the reset signal line TST, the first electrode of the seventeenth transistor T17 is electrically connected to the first voltage end VDD, and the second electrode of the seventeenth transistor T17 is electrically connected to the second node Q2.

When the potential of the reset signal provided by the reset signal line TST is the effective potential, the first electrode of the seventeenth transistor T17 and the second electrode of the seventeenth transistor T17 are conducted, so that the first voltage signal is written into the second node Q2, thereby enabling the effective potential of the second node Q2 to pull down the potential of the cascade output end CR and the potential of the first node Q1.

Further, as shown in FIG. 3, the shift register unit may further include the second pull-down circuit 360 for pulling down the potential of the third node Q3 under the control of the potential of the second node Q2.

The control end of the second pull-down circuit 360 is electrically connected to the second node Q2, the input end of the second pull-down circuit 360 is electrically connected to the third node Q3, and the output end of the second pull-down circuit 360 is electrically connected to the second voltage end VGL. When the potential of the second node Q2 is the effective potential, the third node Q3 and the second voltage end VGL are conducted, thereby pulling down the potential of the third node Q3.

Further, as shown in FIG. 3, the second pull-down circuit 360 includes the eighteenth transistor T18, the control electrode of the eighteenth transistor T18 is electrically connected to the second node Q2, the first electrode of the eighteenth transistor T18 is electrically connected to the third node Q3, and the second electrode of the eighteenth transistor T18 is electrically connected to the second voltage end VGL.

When the potential of the second node Q2 is the effective potential, the first electrode of the eighteenth transistor T18 and the second electrode of the eighteenth transistor T18 are conducted, so that the second voltage signal is written into the third node Q3, and the potential of the third node Q3 is the ineffective potential.

The embodiments of the present disclosure also provide a method for driving the shift register unit, which is operably by the shift register unit as described above, the method includes:
- a first stage, which includes a first stage and a second sub-stage arranged alternately; wherein in the first sub-phase, a first clock signal is written into the first node, so that the output circuit outputs a high potential signal; in the second sub-phase, the input signal controls the first pull-down circuit to pull down the potential of the first node, so that the output circuit outputs a low potential signal;
- in a second stage, which includes a third sub-stage and a fourth sub-stage, wherein in the third sub-phase, a first clock signal is written into the first node, so that the output circuit outputs the high potential signal; in the fourth sub-stage, the capacitor bootstraps to maintain the potential of the first node, and the output circuit continuously outputs the high potential signal; and
- in a third stage, wherein in the third stage, a second clock signal controls the pull-down circuit to pull down the potential of the first node, so that the output circuit outputs the low potential signal.

In the embodiments of the present disclosure, the potential of the first node is directly controlled by the first control circuit and the energy storage circuit, and the potential of the first node is indirectly controlled by the pull-down control circuit and the second control circuit using the first pull-down circuit control, so as to realize a variety of controls on the potential of the first node, and then the pulse width of the gate scanning signal outputted by the output circuit is changed by controlling the potential of the first node, so as to realize the adjustment of the pulse width of the gate scanning signal. Therefore, the technical solution provided by the present disclosure can realize the adjustment of the pulse width of the gate scanning signal to satisfy various display requirements.

Figure 4:
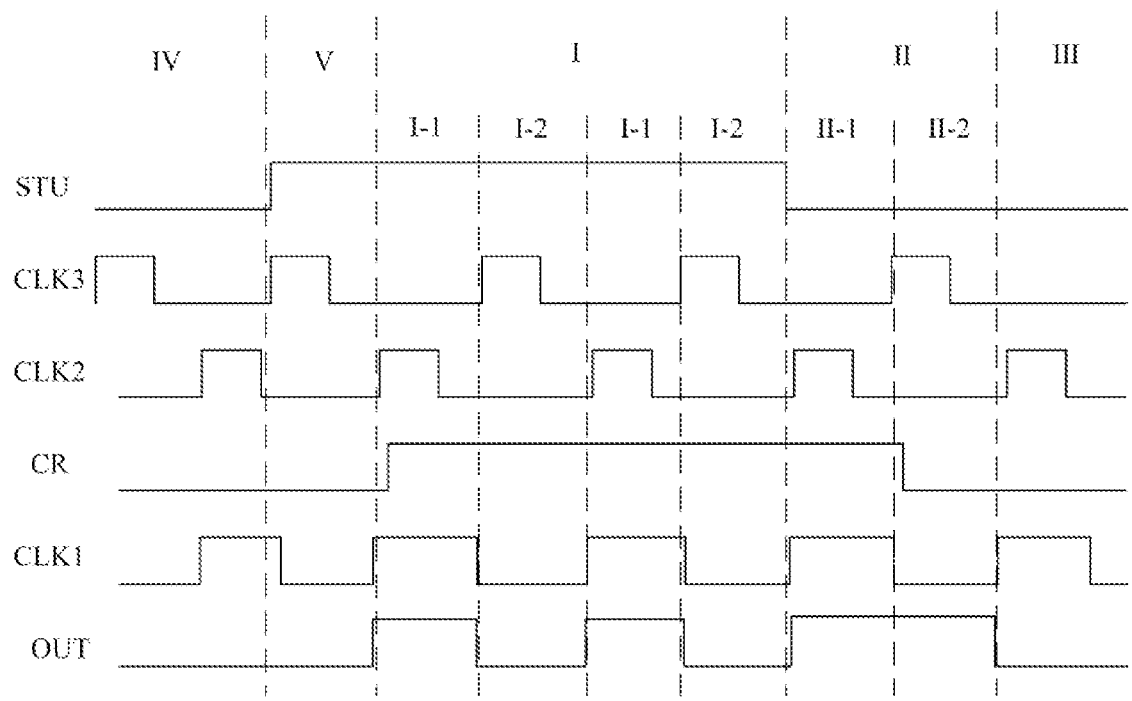
FIG. 4 is a timing diagram for the signals of FIG. 3.

Combined with FIGS. 3 and 4, the first phase I includes a first sub-phase I-1 and a second sub-phase I-2; in the first sub-phase I-1, the potential of the input signal and the potential of the second clock signal are both effective potentials, so that the potential of the third node Q3 is the effective potential, and then the potential of the cascade output end CR is the effective potential, and since the potential of the first clock signal is the effective potential, the potential of the first node Q1 is the effective potential, and at this time, the potential of the signal output end of the output circuit 160 is the effective potential; in the second sub-phase I-2, the potential of the input signal and the potential of the third timing signal are both effective potentials; the first pull-down circuit 140 conducts the first node Q1 and the second voltage end VGL, and pulls down the potential of the first node Q1, and at this time, the potential of the signal output end of the output circuit 160 is the ineffective potential.

The second stage II includes a third sub-stage II-1 and a second sub-stage II-2; in the third sub-phase II-1, the potential of the input signal is the ineffective potential, but since the third capacitor C3 prevents the potential of the second node Q2 from abruptly changing, the second node Q2 is still at the ineffective potential, the potential of the second clock signal is the effective potential, and the potential of the cascade output end CR is still the effective potential, and since the potential of the first clock signal is the effective potential, the potential of the first node Q1 is an effective potential, and at this time, the potential of the signal output end of the output circuit 160 is the effective potential; in the fourth sub-phase II-2, the potential of the third clock signal is the effective potential, the potential of the input signal and the potential of the second clock signal are ineffective potentials, and at this time, the second node Q2 is at the effective potential, and the potential of the cascade output end CR is the ineffective potential. However, since the first capacitor C1 prevents the potential of the first node Q1 from abruptly changing, the first node Q1 is still at the effective potential, and at this time, the potential of the signal output end of the output circuit 160 is still the effective potential.

In the third stage III, the potential of the input signal is the ineffective potential, the potential of the second node Q2 is the effective potential, and the potential of the third node Q3 is the ineffective potential, so that the potential of the cascade output end CR is the ineffective potential; and since the potential of the second clock signal is the effective potential, the effective potential of the second node Q2 is written into the control end of the first pull-down circuit 140, so that the potential of the first node Q1 is the ineffective potential, and at this time, the potential of the signal output end of the output circuit 160 is the ineffective potential.

Further, a fourth stage IV and a fifth stage V may also be included before the first stage I;
- in the fourth stage, the potential of the input signal is the ineffective potential, when the potential of the third clock signal is the effective potential, the potential of the second node Q2 is the effective potential, and the potential of the cascade output end CR and the potential of the signal output end of the output circuit 160 are both ineffective potentials;
- in the fifth stage, the potential of the input signal is the effective potential, the potential of the second node Q2 is the ineffective potential, but since the potential of the second clock signal is the ineffective potential, the potential of the third node Q3 is also the ineffective potential, and the potential of the cascade output end CR and the potential of the signal output end of the output circuit 160 are both ineffective potentials.

Figure 5:
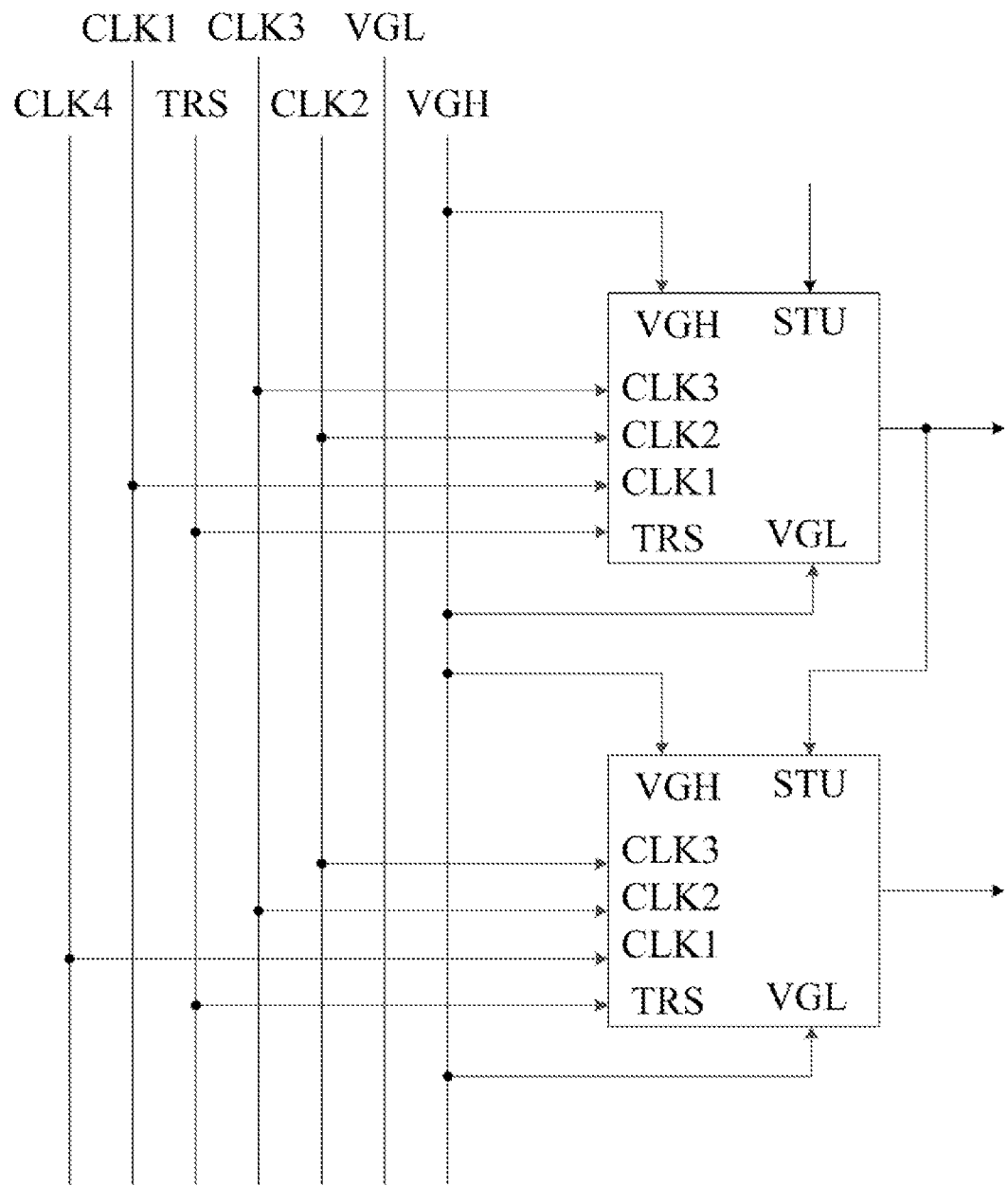
FIG. 5 is a connection schematic diagram of a gate driving circuit provided in an embodiment of the present disclosure.

The disclosed embodiment also provides the gate driving circuit, as shown in FIG. 5, which includes the shift register unit as described above, and respective clock signal lines, second voltage signal lines, and the like.

The embodiments of the present disclosure also provide the display device including the gate driving circuit as described above.

The display device may be a monitor, a cell phone, a tablet, a television, a wearable electronic device, a navigation display device, etc.

Unless defined otherwise, technical or scientific terms used in the present disclosure should have the ordinary meaning as understood by one of ordinary skill in the art to which the disclosure belongs. The use of "first", "second", and the like in this disclosure do not represent any order, quantity, or importance, but are just to distinguish different components. The word "comprises" or "includes", and the like, mean that the presence of an element or item preceding the word covers the presence of the element or item listed after the word and equivalents thereof, but does not exclude other elements or items. "Connect", "mutually connected" or similar words are not limited to physical or mechanical connection but may include electrical connection, either direct or indirect. The terms "upper", "lower", "left", "right" and the like are used only to indicate relative positional relationships that may change accordingly when the absolute position of the object being described changes.

It can be understood that when an element such as a layer, film, region or substrate is referred to as being "on" or "under" another element, it can be "directly on" or "under" the other element, or an intermediate element may be present.

The embodiments of the present disclosure have been described above in conjunction with the accompanying drawings, but the present disclosure is not limited to the above-mentioned specific embodiments, which are merely illustrative rather than restrictive. Under the teaching of the present disclosure, many forms can be made without departing from the scope of the present disclosure and the protection scope of the claims, which all fall within the protection of the present disclosure.

What is claimed is:

1. A shift register unit, comprising a first control circuit, a pull-down control circuit, a second control circuit, a first pull-down circuit, an energy storage circuit, and an output circuit, wherein
the first control circuit is configured for writing a first clock signal provided by a first clock signal end into a first node under control of potential of a cascade output end;
the pull-down control circuit is configured for writing an electrical signal of a second node into a control end of the first pull-down circuit under control of a second clock signal provided by a second clock signal end;
the second control circuit is configured for writing a third clock signal provided by a third clock signal end into the control end of the first pull-down circuit under control of an input signal provided by an input signal end;
the first pull-down circuit is configured for pulling down potential of the first node under control of potential of the control end of the first pull-down circuit;
the energy storage circuit is configured for controlling the potential of the first node;
the output circuit is configured to output a first voltage signal provided by a first voltage end to a signal output end under the control of the potential of the first node.

2. The shift register unit according to claim 1, wherein the first control circuit comprises a first transistor and a second transistor, wherein a control electrode of the first transistor is electrically connected to the cascade output end, a first electrode of the first transistor is electrically connected to the first clock signal end, a second electrode of the first transistor is electrically connected to a first electrode of the second transistor, a second electrode of the second transistor is electrically connected to the first node, and a control electrode of the second transistor is electrically connected to the first clock signal end.

3. The shift register unit according to claim 1, wherein the first pull-down circuit comprises a third transistor, wherein a control electrode of the third transistor is electrically connected to the output end of the pull-down control circuit, a first electrode of the third transistor is electrically connected to the first node, and a second electrode of the third transistor is electrically connected to the second voltage end.

4. The shift register unit according to claim 1, wherein the pull-down control circuit comprises a fourth transistor, wherein a control electrode of the fourth transistor is electrically connected to the second clock signal end, a first electrode of the fourth transistor is electrically connected to the second node, and a second electrode of the fourth transistor is electrically connected to the control end of the first pull-down circuit.

5. The shift register unit according to claim 1, wherein the output circuit comprises a fifth transistor and a sixth transistor,
wherein a first electrode of the fifth transistor is electrically connected to the first voltage end, a second electrode of the fifth transistor is electrically connected to a first electrode of the sixth transistor, and a control electrode of the fifth transistor is electrically connected to the first node;
a control electrode of the sixth transistor is electrically connected to the control end of the pull-down control circuit, and a second electrode of the sixth transistor is electrically connected to the second voltage end.

6. The shift register unit according to claim 1, wherein the second control circuit comprises a seventh transistor, wherein a control electrode of the seventh transistor is electrically connected to the input signal end, a first electrode of the seventh transistor is electrically connected to the third clock signal end, and a second electrode of the seventh transistor is electrically connected to the control end of the first pull-down circuit.

7. The shift register unit according to claim 1, wherein the energy storage circuit comprises a capacitor, wherein an end of the capacitor is electrically connected to the first voltage end, and the other end of the capacitor is electrically connected to the first node.

8. The shift register unit according to claim 1, wherein the shift register unit further comprises an input circuit, a third control circuit, an inverter circuit, and a cascade circuit, wherein
the input circuit is configured for writing the input signal provided by the input signal end into a control end of the third control circuit under control of the third clock signal;
the third control circuit is configured for writing a second clock signal provided by the second clock signal end into a third node under control of the input signal;
the inverter circuit is configured for writing to the second node an electrical signal whose potential is opposite to an potential of the third node; and
the cascade circuit is configured for writing the first voltage signal provided by the first voltage end into the cascade output end under control of the potential of the third node.

9. The shift register unit according to claim 8, wherein the input circuit comprises an eighth transistor, wherein a control electrode of the eighth transistor is electrically connected to the third clock signal end, a first electrode of the eighth transistor is electrically connected to the input signal end, and a second electrode of the eighth transistor is electrically connected to a control electrode of the third control circuit.

10. The shift register unit according to claim 8, wherein the third control circuit comprises a ninth transistor and a tenth transistor, wherein
a control electrode of the ninth transistor is electrically connected to an output end of the input circuit, a first electrode of the ninth transistor is electrically connected to a second timing signal end, and a second electrode of the ninth transistor is electrically connected to a first electrode of the tenth transistor;

a control electrode of the tenth transistor is electrically connected to the second timing signal end, and a second electrode of the tenth transistor is electrically connected to the third node.

11. The shift register unit according to claim 8, wherein the inverter circuit comprises an eleventh transistor, a twelfth transistor, a thirteenth transistor, and a fourteenth transistor, wherein a control electrode of the eleventh transistor is electrically connected to the first voltage end, a first electrode of the eleventh transistor is electrically connected to a third timing signal end, and a second electrode of the eleventh transistor is electrically connected to a control electrode of the twelfth transistor;

a first electrode of the twelfth transistor is electrically connected to the first voltage end, and a second electrode of the twelfth transistor is electrically connected to the second node;

a control electrode of the thirteenth transistor is electrically connected to the input signal end, a first electrode of the thirteenth transistor is electrically connected to the second electrode of the eleventh transistor, and a second electrode of the thirteenth transistor is electrically connected to the second voltage end;

a control electrode of the fourteenth transistor is electrically connected to the input signal end, a first electrode of the fourteenth transistor is electrically connected to the second node, and ae second electrode of the fourteenth transistor is electrically connected to the second voltage end.

12. The shift register unit according to claim 8, wherein the cascade circuit comprises a fifteenth transistor and a sixteenth transistor, wherein a control electrode of the fifteenth transistor is electrically connected to the third node, a first electrode of the fifteenth transistor is electrically connected to the first voltage end, and a second electrode of the fifteenth transistor is electrically connected to the cascade output end;

a control electrode of the sixteenth transistor is electrically connected to the second node, a first electrode of the sixteenth transistor is electrically connected to the second electrode of the fifteenth transistor, and a second electrode of the sixteenth transistor is electrically connected to the second voltage end.

13. The shift register unit according to claim 8, wherein the shift register further comprises a reset circuit, wherein the reset circuit is configured to pull up potential of the second node under control of a reset signal provided by a reset signal line.

14. The shift register unit according to claim 13, wherein the reset circuit comprises a seventeenth transistor, a control electrode of the seventeenth transistor is electrically connected to the reset signal line, a first electrode of the seventeenth transistor is electrically connected to the first voltage end, and a second electrode of the seventeenth transistor is electrically connected to the second node.

15. A method for driving a shift register unit, wherein the method is operable by the shift register unit according to claim 1, and the method comprises:

a first stage, which comprises a first sub-stage and a second sub-stage that are arranged alternately, wherein in the first sub-phase, the first clock signal is written into the first node, to enable the output circuit to output a high potential signal; in the second sub-phase, the input signal controls the first pull-down circuit to pull down the potential of the first node, to enable the output circuit to output a low potential signal;

a second stage, which comprises a third sub-stage and a fourth sub-stage, wherein in the third sub-phase, the first clock signal is written into the first node, to enable the output circuit to output the high potential signal; in the fourth sub-phase, the capacitor bootstraps to maintain the potential of the first node, and the output circuit continuously outputs the high potential signal; and a third stage, wherein in the third stage, a second clock signal controls the pull-down circuit to pull down the potential of the first node, to enable the output circuit to output a low potential signal.

16. A gate drive circuit, comprising the shift register unit according to claim 1.

17. A display device, comprising the gate driving circuit according to claim 16.

18. The gate drive circuit according to claim 16, wherein the first control circuit comprises a first transistor and a second transistor, wherein a control electrode of the first transistor is electrically connected to the cascade output end, a first electrode of the first transistor is electrically connected to the first clock signal end, a second electrode of the first transistor is electrically connected to a first electrode of the second transistor, a second electrode of the second transistor is electrically connected to the first node, and a control electrode of the second transistor is electrically connected to the first clock signal end.

19. The gate drive circuit according to claim 16, wherein the first pull-down circuit comprises a third transistor, wherein a control electrode of the third transistor is electrically connected to the output end of the pull-down control circuit, a first electrode of the third transistor is electrically connected to the first node, and a second electrode of the third transistor is electrically connected to the second voltage end.

20. The gate drive circuit according to claim 16, wherein the pull-down control circuit comprises a fourth transistor, wherein a control electrode of the fourth transistor is electrically connected to the second clock signal end, a first electrode of the fourth transistor is electrically connected to the second node, and a second electrode of the fourth transistor is electrically connected to the control end of the first pull-down circuit.

* * * * *